United States Patent
Feng et al.

(10) Patent No.: US 10,008,615 B1
(45) Date of Patent: Jun. 26, 2018

(54) SEMICONDUCTOR DEVICE AND MANUFACTURING METHOD THEREOF

(71) Applicant: UNITED MICROELECTRONICS CORP., Hsinchu (TW)

(72) Inventors: Ya-Sheng Feng, Tainan (TW);
Chi-Cheng Huang, Kaohsiung (TW);
Ping-Chia Shih, Tainan (TW);
Hung-Wei Lin, Kaohsiung (TW);
Yu-Chun Chen, Kaohsiung (TW);
Ling-Hsiu Chou, Tainan (TW);
An-Hsiu Cheng, Pingtung County (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 5 days.

(21) Appl. No.: 15/437,740

(22) Filed: Feb. 21, 2017

(30) Foreign Application Priority Data

Dec. 23, 2016 (TW) .............................. 105143007 A

(51) Int. Cl.
*H01L 29/423* (2006.01)
*H01L 29/792* (2006.01)
*H01L 29/66* (2006.01)
*H01L 21/8234* (2006.01)

(52) U.S. Cl.
CPC .... *H01L 29/792* (2013.01); *H01L 21/823462* (2013.01); *H01L 29/4234* (2013.01); *H01L 29/42368* (2013.01); *H01L 29/66833* (2013.01)

(58) Field of Classification Search
CPC ............. H01L 21/02225; H01L 21/702; H01L 21/8232; H01L 29/66007
See application file for complete search history.

(56) References Cited

U.S. PATENT DOCUMENTS

2007/0145472 A1   6/2007   Kwak

*Primary Examiner* — Cheung Lee
(74) *Attorney, Agent, or Firm* — WPAT, PC

(57) ABSTRACT

A semiconductor device and a manufacturing method thereof are provided. The semiconductor device includes a semiconductor substrate having a tunneling well, a tunneling oxide layer, a charge storage layer and a control gate. The tunneling oxide layer is disposed on the tunneling well. The tunneling oxide layer includes a first tunneling oxide segment having a first thickness, a second tunneling oxide segment having a second thickness, and a third tunneling oxide segment having a third thickness, and the first thickness, the second thickness and the third thickness are different from each other. The charge storage layer is disposed on the tunneling oxide layer, and the control gate is disposed on the charge storage layer.

23 Claims, 7 Drawing Sheets

US 10,008,615 B1

SEMICONDUCTOR DEVICE AND MANUFACTURING METHOD THEREOF

This application claims the benefit of Taiwan application Serial No. 105143007, filed Dec. 23, 2016, the subject matter of which is incorporated herein by reference.

BACKGROUND

Technical Field

The present disclosure relates in general to a semiconductor device and a manufacturing method thereof, and more particularly to a semiconductor device used for memory devices and a manufacturing method thereof.

Description of the Related Art

Due to the current demands and trends of size miniaturization and increased memory densities of memory devices, the difficulties of manufacturing memory devices are greatly increased. Therefore, the manufacture and improvements of memory devices which have increased memory densities and reduced sizes is the current main subject in industries.

SUMMARY OF THE INVENTION

The present disclosure is directed to a semiconductor device and a manufacturing method thereof. According to the embodiments of the present disclosure, by applying three different operating voltages for selecting three different tunneling oxide segments having different thicknesses, three different memory states can be represented, thereby the amount and the occupied area of components in a memory device can be effectively reduced, and thus the memory density can be further increased.

According to an embodiment of the present disclosure, a semiconductor device is disclosed. The semiconductor device includes a semiconductor substrate, a tunneling oxide layer, a charge storage layer, and a control gate. The semiconductor substrate has a tunneling well. The tunneling oxide layer is disposed on the tunneling well. The tunneling oxide layer includes a first tunneling oxide segment, a second tunneling oxide segment and a third tunneling oxide segment. The first tunneling oxide segment has a first thickness, the second tunneling oxide segment has a second thickness, and the third tunneling oxide segment has a third thickness. The first thickness, the second thickness and the third thickness are different from each other. The charge storage layer is disposed on the tunneling oxide layer, and the control gate is disposed on the charge storage layer.

According to another embodiment of the present disclosure, a manufacturing method of a semiconductor device is disclosed. The manufacturing method of the semiconductor device includes the following steps: providing a semiconductor substrate, the semiconductor substrate having a tunneling well; forming a tunneling oxide layer on the tunneling well, wherein forming the tunneling oxide layer includes: forming a first tunneling oxide segment having a first thickness; forming a second tunneling oxide segment having a second thickness; and forming a third tunneling oxide segment having a third thickness, wherein the first thickness, the second thickness and the third thickness are different from each other; forming a charge storage layer on the tunneling oxide layer; and forming a control gate on the charge storage layer.

The disclosure will become apparent from the following detailed description of the preferred but non-limiting embodiments. The following description is made with reference to the accompanying drawings.

DETAILED DESCRIPTION OF THE INVENTION

Figure 1A:
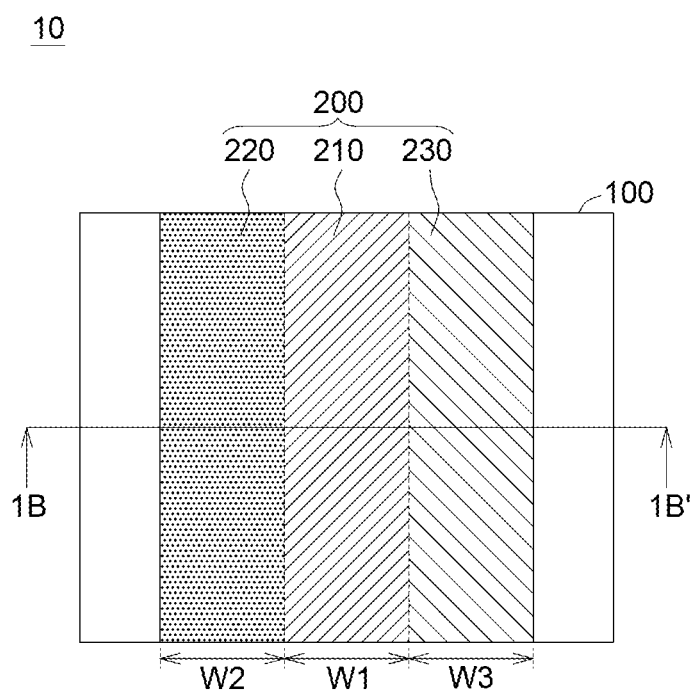
FIG. 1A is a top view of a semiconductor device according to an embodiment of the present disclosure.

According to the embodiments of the present disclosure, a semiconductor device and a manufacturing method thereof are provided. The embodiments are described in details with reference to the accompanying drawings. The procedures and details of the embodiments are for exemplification only, not for limiting the scope of protection of the disclosure. Moreover, the identical or similar elements of the embodiments are designated with the same reference numerals. Also, it is also important to point out that the illustrations may not be necessarily be drawn to scale, and that there may be other embodiments of the present disclosure which are not specifically illustrated. Thus, the specification and the drawings are to be regard as an illustrative sense rather than a restrictive sense. It is to be noted that the drawings are simplified for clearly describing the embodiments, and the details of the structures of the embodiments are for exemplification only, not for limiting the scope of protection of the disclosure. Ones having ordinary skills in the art may modify or change the structures according to the embodiments of the present disclosure.

Figure 1B:
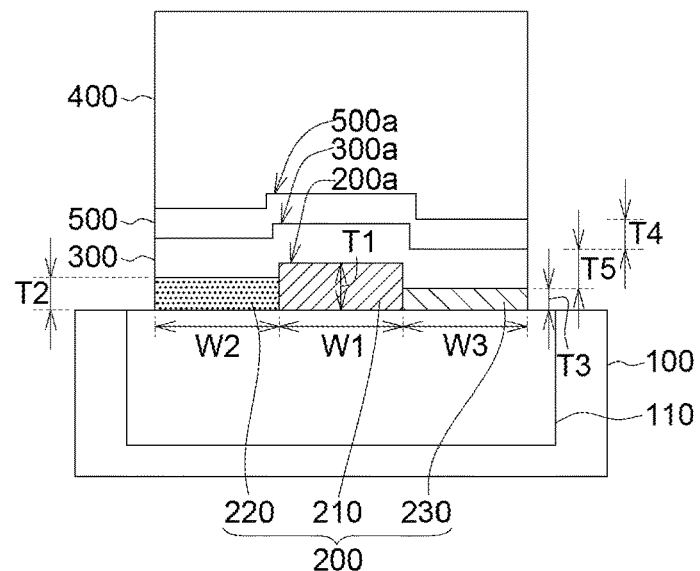
FIG. 1B is a cross-sectional view along the cross-section line 1B-1B' in FIG. 1A.

FIG. 1A is a top view of a semiconductor device according to an embodiment of the present disclosure, and FIG. 1B is a cross-sectional view along the cross-section line 1B-1B' in FIG. 1A. As shown in FIGS. 1A-1B, the semiconductor device 10 includes a semiconductor substrate 100, a tunneling oxide layer 200, a charge storage layer 300 and a control gate 400. The semiconductor substrate 100 has a tunneling well 110. The tunneling oxide layer 200 is disposed on the tunneling well 110. The tunneling oxide layer 200 includes a first tunneling oxide segment 210, a second tunneling oxide segment 220 and a third tunneling oxide segment 230. The first tunneling oxide segment 210 has a first thickness T1, the second tunneling oxide segment 220 has a second thickness T2, and the third tunneling oxide segment 230 has a third thickness T3. The first thickness T1, the second thickness T2 and the third thickness T3 are different from each other. The charge storage layer 300 is disposed on the tunneling oxide layer 200, and the control gate 400 is disposed on the charge storage layer 300.

According to the embodiments of the present disclosure, the semiconductor device 10 is such as a memory device, and the tunneling oxide layer 200 includes three tunneling oxide segments (e.g. the first tunneling oxide segment 210, the second tunneling oxide segment 220 and the third tunneling oxide segment 230) having three different thicknesses (e.g. the first thickness T1, the second thickness T2 and the third thickness T3) and thus can correspond to three different operating voltages, thereby three different memory states can be represented. In other words, according to the embodiments of the present disclosure, instead of using three memory cells to represent three memory states, only one memory cell is needed; by applying three different operating voltages for selecting three different tunneling oxide segments having different thicknesses, three different memory states can be represented, thereby the amount and the occupied area of components in a memory device can be effectively reduced, and thus the memory density can be further increased.

According to the embodiments of the present disclosure, one of the first tunneling oxide segment 210, the second tunneling oxide segment 220 and the third tunneling oxide segment 230 is adjacent to and directly contacts the other two of the first tunneling oxide segment 210, the second tunneling oxide segment 220 and the third tunneling oxide segment 230. As shown in FIGS. 1A-1B, the first tunneling oxide segment 210 is adjacent to the second tunneling oxide segment 220 and the third tunneling oxide segment 230, and the first tunneling oxide segment 210 directly contacts the second tunneling oxide segment 220 and the third tunneling oxide segment 230.

As shown in FIGS. 1A-1B, the first tunneling oxide segment 210 is located between the second tunneling oxide segment 220 and the third tunneling oxide segment 230, and the first tunneling oxide segment 210, the second tunneling oxide segment 220 and the third tunneling oxide segment 230 form the continuous tunneling oxide layer 200.

In some embodiments, the first thickness T1 is larger than the second thickness T2 by about 36-38 Å, and the second thickness T2 is larger than the third thickness T3 by about 3-5 Å.

In some embodiments, the first thickness T1 is such as 56.5-57.5 Å, the second thickness T2 is such as 19.5-20.5 Å, and the third thickness T3 is such as 15.5-16.5 Å.

As shown in FIG. 1B, since the first tunneling oxide segment 210, the second tunneling oxide segment 220 and the third tunneling oxide segment 230 of the tunneling oxide layer 200 are all formed on the tunneling well 110 and have different thicknesses, such that the top surface 200a of the tunneling oxide layer 200 has an uneven morphology corresponding to the thickness variation.

In the embodiment, as shown in FIG. 1B, the charge storage layer 300 is formed directly on the top surface 200a of the tunneling oxide layer 200, and a top surface 300a of the charge storage layer 300 is substantially conformal with the top surface 200a of the tunneling oxide layer 200.

In the embodiment, as shown in FIG. 1B, the semiconductor device 10 may further include an insulating layer 500. The insulating layer 500 is located between the charge storage layer 300 and the control gate 400. In some embodiments, the insulating layer 500 has a thickness T4 of such as 39-41 Å.

In the embodiment, as shown in FIG. 1B, the insulating layer 500 is formed directly on the top surface 300a of the charge storage layer 300, and a top surface 500a of the insulating layer 500 is substantially conformal with the top surface 300a of the charge storage layer 300a. Accordingly, the top surface 500a of the insulating layer 500 is substantially conformal with the top surface 200a of the tunneling oxide layer 200.

In some embodiments, as shown in FIGS. 1A-1B, a cross-sectional width W1 of the first tunneling oxide segment 210, a cross-sectional width W2 of the second tunneling oxide segment 220, and a cross-sectional width W3 of the third tunneling oxide segment 230 are substantially the same.

In some embodiments, as shown in FIG. 1A, the top view patterns of the first tunneling oxide segment 210, the second tunneling oxide segment 220 and the third tunneling oxide segment 230 are such as rectangular patterns, and the widths of the rectangular patterns are the above-mentioned cross-sectional widths W1, W2 and W3. In the embodiment, as shown in FIG. 1A, the first tunneling oxide segment 210, the second tunneling oxide segment 220 and the third tunneling oxide segment 230 are rectangular and are arranged adjacent to each other with the long sides. It is to be noted that the above-mentioned top view patterns are embodiments and are for exemplification only, not for limiting the scope of protection of the disclosure.

In some embodiments, the charge storage layer 300 has a thickness T5 of such as 69-71 Å.

Figure 2A:
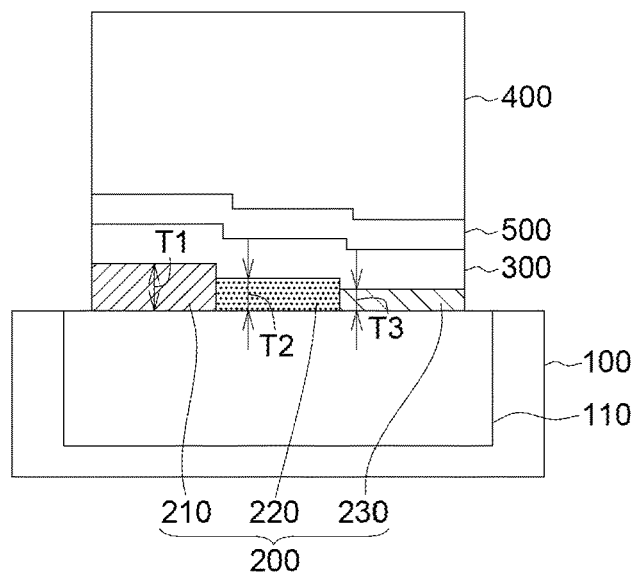
FIG. 2A is a schematic view of a semiconductor device according to another embodiment of the present disclosure.

FIG. 2A is a schematic view of a semiconductor device according to another embodiment of the present disclosure. The elements in the present embodiment sharing similar or the same labels with those in the previous embodiment are similar or the same elements, and the description of which is omitted.

The semiconductor device 20A of the present embodiment is different from the semiconductor device 10 of the previous embodiment mainly in the arrangement of the first tunneling oxide segment 210, the second tunneling oxide segment 220 and the third tunneling oxide segment 230 of the tunneling oxide layer 200. As shown in FIG. 2A, the second tunneling oxide segment 220 is adjacent to the first tunneling oxide segment 210 and the third tunneling oxide segment 230, and the second tunneling oxide segment 220 directly contacts the first tunneling oxide segment 210 and the third tunneling oxide segment 230.

As shown in FIG. 2A, the second tunneling oxide segment 220 is located between the first tunneling oxide segment 210 and the third tunneling oxide segment 230, and the first tunneling oxide segment 210, the second tunneling oxide segment 220 and the third tunneling oxide segment 230 form the continuous tunneling oxide layer 200.

Figure 2B:
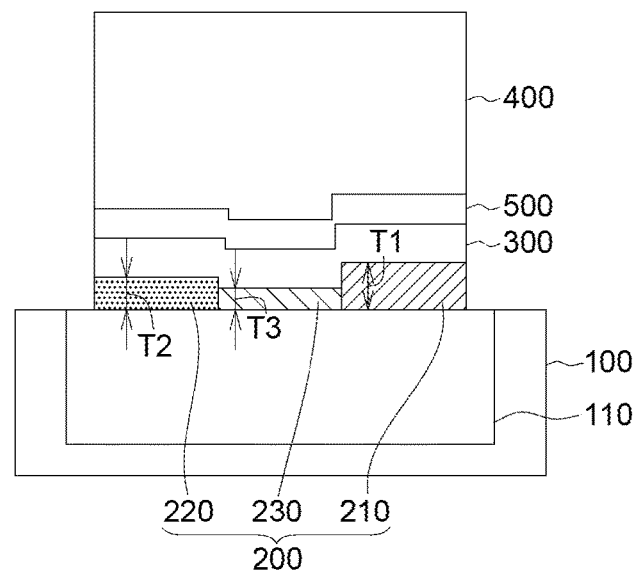
FIG. 2B is a schematic view of a semiconductor device according to a further embodiment of the present disclosure.

FIG. 2B is a schematic view of a semiconductor device according to a further embodiment of the present disclosure. The elements in the present embodiment sharing similar or the same labels with those in the previous embodiments are similar or the same elements, and the description of which is omitted.

The semiconductor device 20B of the present embodiment is different from the semiconductor device 10 of the previous embodiment mainly in the arrangement of the first tunneling oxide segment 210, the second tunneling oxide segment 220 and the third tunneling oxide segment 230 of the tunneling oxide layer 200. As shown in FIG. 2B, the third tunneling oxide segment 230 is adjacent to the first tunneling oxide segment 210 and the second tunneling oxide segment 220, and the third tunneling oxide segment 230 directly contacts the first tunneling oxide segment 210 and the second tunneling oxide segment 220.

As shown in FIG. 2B, the third tunneling oxide segment 230 is located between the first tunneling oxide segment 210 and the second tunneling oxide segment 220, and the first tunneling oxide segment 210, the second tunneling oxide segment 220 and the third tunneling oxide segment 230 form the continuous tunneling oxide layer 200.

It is to be noted that in the structures as shown in previously presented FIGS. 1A-1B, 2A and 2B, the arrangements of the first tunneling oxide segment 210, the second tunneling oxide segment 220 and the third tunneling oxide segment 230 are embodiments and are for exemplification only, not for limiting the scope of protection of the disclosure. According to the embodiments of the present disclosure, the arranging order of the first tunneling oxide segment 210, the second tunneling oxide segment 220 and the third tunneling oxide segment 230 of the tunneling oxide layer 200 can be changed in various fashions as long as the condition that the three tunneling oxide segments have different thicknesses and three different memory states can be represented can be satisfied.

Further explanation is provided with the following examples. An embodiment is listed for showing the properties of semiconductor device according to the embodiments of the disclosure. However, the following examples are for purposes of describing particular embodiments only, and are not intended to be limiting.

Table 1 shows the first thickness T1 of the first tunneling oxide segment 210, the second thickness T2 of the second tunneling oxide segment 220, the third thickness T3 of the third tunneling oxide segment 230, and the program voltages and the erase voltages corresponding to these tunneling oxide segments respectively. In table 1, $V_P$ represents the program voltages, and $V_E$ represents the erase voltages.

TABLE 1

| Tunneling oxide layer | Thickness (Å) | $V_P$ (V) | $V_E$ (V) |
|---|---|---|---|
| Third tunneling oxide segment | 16 | 7.5 ± 0.1 | −7.5 ± 0.1 |
| Second tunneling oxide segment | 20 | 8.3 ± 0.1 | −8.3 ± 0.1 |
| First tunneling oxide segment | 57 | 20 ± 1 | −20 ± 1 |

As shown in table 1, by applying three different operating voltages (program voltages and erase voltages), three different tunneling oxide segments having different thicknesses can be selected, and three different memory states can be represented.

FIGS. 3A-3J show a manufacturing process of a semiconductor device according to an embodiment of the present disclosure. The elements in the present embodiment sharing similar or the same labels with those in the previous embodiments are similar or the same elements, and the description of which is omitted.

Figure 3A:
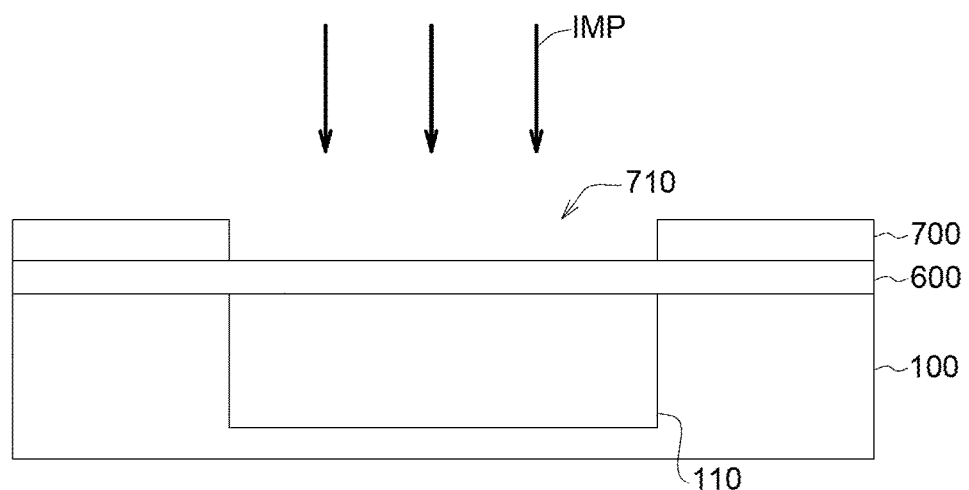
FIGS. 3A-3J show a manufacturing process of a semiconductor device according to an embodiment of the present disclosure.

Please refer to FIG. 3A, a semiconductor substrate 100 is provided. The semiconductor substrate 100 has a tunneling well 110.

In the embodiment, as shown in FIG. 3A, a pad oxide 600 may be formed on the tunneling well 110, and a patterned hard mask 700 may be formed on the pad oxide 600. The patterned hard mask 700 has an opening 710 for defining the location of the tunneling well 110. In the embodiment, for example, an implantation process IMP is performed for forming the tunneling well 110 in the semiconductor substrate 100. In the embodiment, the tunneling well 110 is such as a p type well.

Figure 3B:
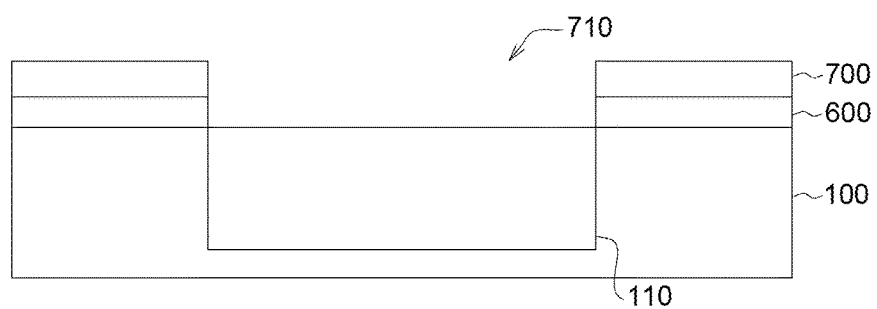

Please refer to FIG. 3B, a portion of the pad oxide 600 within the opening 710 and correspondingly located above the tunneling well 110 is removed. In the embodiment, for example, an etching process is performed for removing the portion of the pad oxide 600.

Figure 3C:
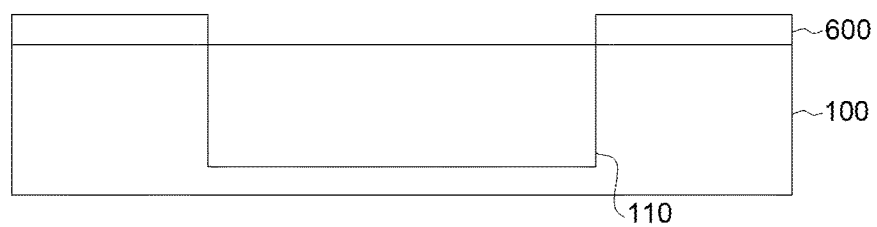

Please refer to FIG. 3C, the patterned hard mask 700 is removed.

Please refer to FIGS. 3D-3J, a tunneling oxide layer 200 is formed on the tunneling well 110, wherein forming the tunneling oxide layer 200 includes: forming a first tunneling oxide segment 210 having a first thickness T1; forming a second tunneling oxide segment 220 having a second thickness T2; and forming a third tunneling oxide segment 230 having a third thickness T3, wherein the first thickness T1, the second thickness T2 and the third thickness T3 are different from each other. The manufacturing process of forming the tunneling oxide layer 200 may include such as the following steps.

Figure 3D:
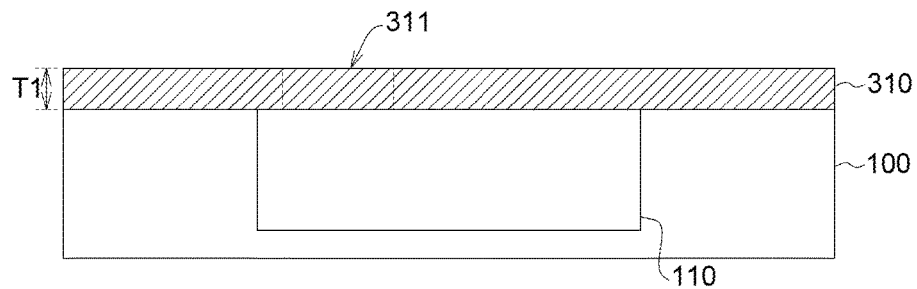

As shown in FIG. 3D, a first oxide layer 310 is formed on the semiconductor substrate 100. In the embodiment, the first oxide layer 310 and the first tunneling oxide segment 210 which will be formed subsequently have the same thickness; that is, the first oxide layer 310 has the first thickness T1.

Figure 3E:
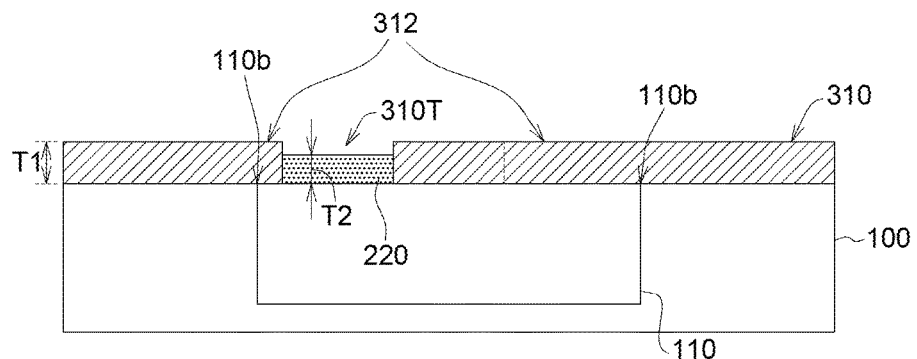

As shown in FIG. 3E, a first portion 311 of the first oxide layer 310 is removed for forming a first trench 310T. In the embodiment, for example, the first portion 311 of the first oxide layer 310 is removed by a photolithography etching process. Next, the second tunneling oxide segment 220 is formed in the first trench 310T. In the embodiment, for example, an oxide is filled in the first trench 310T until it reaches the predetermined second thickness T2 of the second tunneling oxide segment 220.

Figure 3F:
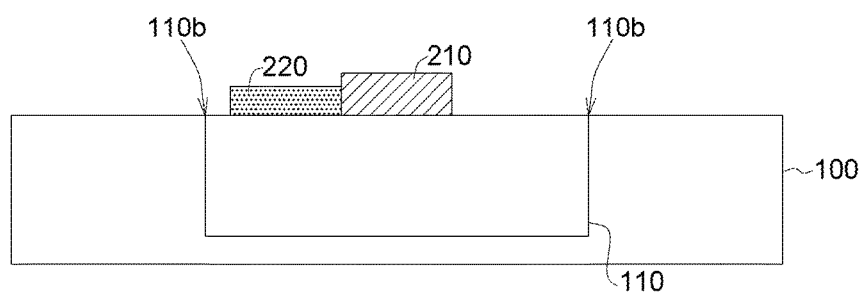

As shown in FIG. 3F, after the oxide is filled in the first trench 310T for forming the second tunneling oxide segment 220, a second portion 312 of the first oxide layer 310 is removed for forming the first tunneling oxide segment 210. As shown in FIGS. 3E-3F, the to-be-removed second portion 312 is located on two sides of the first trench 310T and the as-formed first tunneling oxide segment 310 and above boundaries 110b of the tunneling well 110, such that the first trench 310T and the as-formed first tunneling oxide segment 310 are located within the boundaries 110b of the tunneling well 110. In the embodiment, for example, the second portion 312 of the first oxide layer 310 is removed by a photolithography etching process.

Figure 3G:
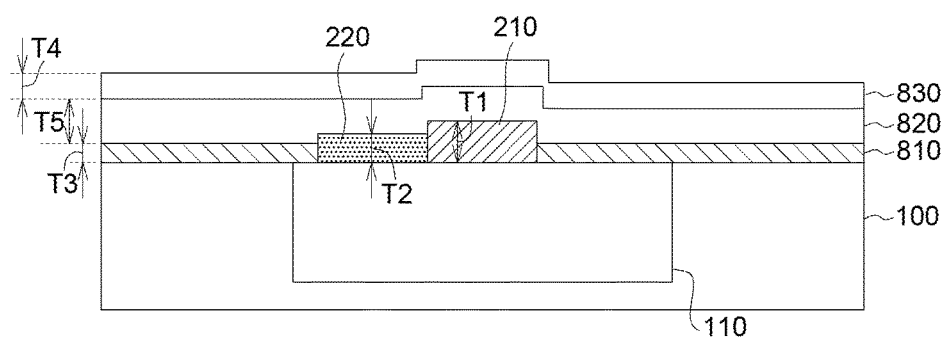

As shown in FIG. 3G, after the first tunneling oxide segment 210 and the second tunneling oxide segment 220 are formed, an oxide layer 810 is formed on the semiconductor substrate 100. In the embodiment, the oxide layer 810 and the third tunneling oxide segment 230 which will be formed subsequently have the same thickness; that is, the oxide layer 810 has the third thickness T3. The oxide layer 810 is adjacent to the first tunneling oxide segment 210 and the second tunneling oxide segment 220, and the oxide layer 810 directly contacts the first tunneling oxide segment 210 and the second tunneling oxide segment 220.

Next, as shown in FIG. 3G, a charge storage material 820 is formed on the oxide layer 810, and an insulating material 830 is formed on the charge storage material 820. In the embodiment, the charge storage material 820 and the charge storage layer 300 which will be formed subsequently have the same thickness; that is, the charge storage material 820 has the thickness T5. In the embodiment, the insulating material 830 and the insulating layer 500 which will be formed subsequently have the same thickness; that is, the insulating material 830 has the thickness T4.

Figure 3H:
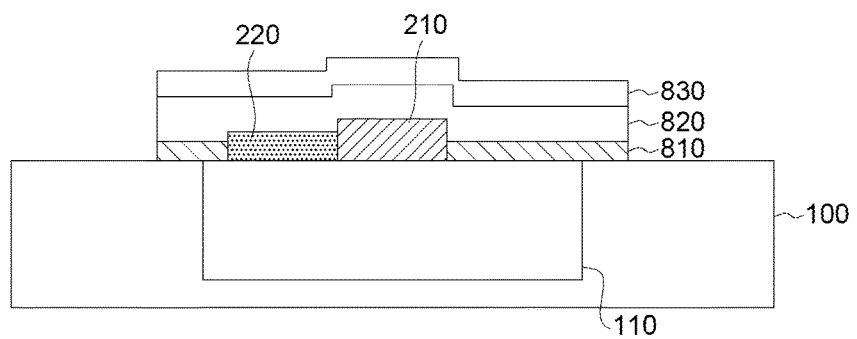
Figure 3I:
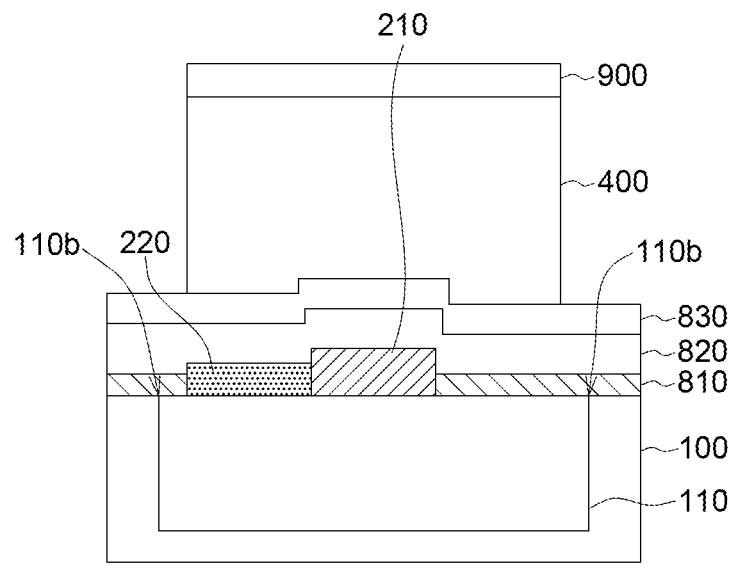

As shown in FIG. 3H, the oxide layer 810, the charge storage material 820 and the insulating material 830 are partially removed, and the remaining oxide layer 810, the remaining charge storage material 820 and the remaining insulating material 830 cover the region which correspond to the tunneling well 110. In addition, the remaining charge storage material 820 and the remaining insulating material 830 cover the first tunneling oxide segment 210 and the second tunneling oxide segment 220.

Figure 3J:
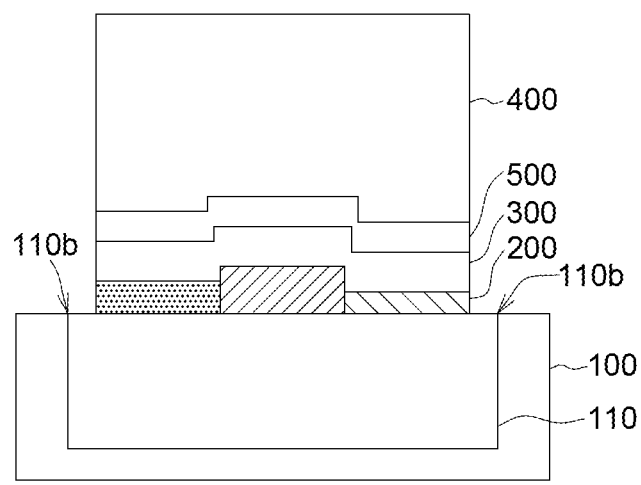

As shown in FIG. 3J, the control gate 400 is formed on the insulating material 830, and a hard mask 900 is formed on the control gate 400. In the embodiment, a material of the control gate 400 is such as polysilicon.

As shown in FIG. 3J, the oxide layer 810, the charge storage material 820 and the insulating material 830 are further partially removed for forming the third tunneling oxide segment 230, the charge storage layer 300 and the insulating layer 500 on the tunneling well 110 and located within the boundaries 110b of the tunneling well 110; that is, forming the charge storage layer 300 and forming the third tunneling oxide segment 230 are performed in the same step. The hard mask 900 is removed. As such, the tunneling oxide layer 200 including the first tunneling oxide segment 210, the second tunneling oxide segment 220 and the third tunneling oxide segment 230 is formed. In other words, in the embodiments, forming the third tunneling oxide segment 230 is performed after forming the second tunneling oxide segment 220; in addition, forming the charge storage layer 300 is performed after forming the first tunneling oxide segment 210 and forming the second tunneling oxide segment 220. As shown in FIG. 3J, the charge storage layer 300 is formed on the tunneling oxide layer 200, and the control gate 400 is formed on the charge storage layer 300. In the embodiment, as shown in FIG. 3J, the insulating layer 500 is formed on the charge storage layer 300, and the control gate 400 is formed on the insulating layer 500 after the insulating layer 500 is formed on the charge storage layer 300.

As such, the semiconductor device 10 as shown in FIGS. 1A-1B is formed.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor device, comprising:
a semiconductor substrate having a tunneling well;
a tunneling oxide layer disposed on the tunneling well, wherein the tunneling oxide layer comprises:
a first tunneling oxide segment having a first thickness;
a second tunneling oxide segment having a second thickness; and
a third tunneling oxide segment having a third thickness, wherein the first thickness, the second thickness and the third thickness are different from each other;
a charge storage layer disposed on the tunneling oxide layer; and
a control gate disposed on the charge storage layer.

2. The semiconductor device according to claim 1, wherein the first thickness is larger than the second thickness by 36-38 Å, and the second thickness is larger than the third thickness by 3-5 Å.

3. The semiconductor device according to claim 1, wherein the first thickness is 56.5-57.5 Å.

4. The semiconductor device according to claim 1, wherein the second thickness is 19.5-20.5 Å.

5. The semiconductor device according to claim 1, wherein the third thickness is 15.5-16.5 Å.

6. The semiconductor device according to claim 1, further comprising:
an insulating layer located between the charge storage layer and the control gate.

7. The semiconductor device according to claim 6, wherein the insulating layer has a thickness of 39-41 Å.

8. The semiconductor device according to claim 6, wherein a top surface of the insulating layer is substantially conformal with a top surface of the tunneling oxide layer.

9. The semiconductor device according to claim 1, wherein the charge storage layer has a thickness of 69-71 Å.

10. The semiconductor device according to claim 1, wherein one of the first tunneling oxide segment, the second tunneling oxide segment and the third tunneling oxide segment is adjacent to and directly contacts the other two of the first tunneling oxide segment, the second tunneling oxide segment and the third tunneling oxide segment.

11. The semiconductor device according to claim 1, wherein a cross-sectional width of the first tunneling oxide segment, a cross-sectional width of the second tunneling oxide segment, and a cross-sectional width of the third tunneling oxide segment are substantially the same.

12. A manufacturing method of a semiconductor device, comprising:
providing a semiconductor substrate, the semiconductor substrate having a tunneling well;
forming a tunneling oxide layer on the tunneling well, wherein forming the tunneling oxide layer comprises:
forming a first tunneling oxide segment having a first thickness;
forming a second tunneling oxide segment having a second thickness; and
forming a third tunneling oxide segment having a third thickness, wherein the first thickness, the second thickness and the third thickness are different from each other;
forming a charge storage layer on the tunneling oxide layer; and
forming a control gate on the charge storage layer.

13. The manufacturing method of the semiconductor device according to claim 12, wherein providing the semiconductor substrate comprises:
performing an implantation process for forming the tunneling well in the semiconductor substrate.

14. The manufacturing method of the semiconductor device according to claim 12, wherein forming the first tunneling oxide segment comprises:
forming a first oxide layer on the semiconductor substrate;
removing a first portion of the first oxide layer for forming a first trench; and
removing a second portion of the first oxide layer for forming the first tunneling oxide segment on the tunneling well, wherein the second portion is located on two sides of the first trench and the first tunneling oxide segment and above boundaries of the tunneling well, such that the first trench and the first tunneling oxide segment are located within the boundaries of the tunneling well.

15. The manufacturing method of the semiconductor device according to claim 14, wherein forming the second tunneling oxide segment comprises:
filling an oxide in the first trench, wherein removing the second portion is performed after filling the oxide in the first trench.

16. The manufacturing method of the semiconductor device according to claim 12, wherein forming the third tunneling oxide segment comprises:

forming an oxide layer on the semiconductor substrate after forming the first tunneling oxide segment and forming the second tunneling oxide segment; and partially removing the oxide layer for forming the third tunneling oxide segment on the tunneling well and located within boundaries of the tunneling well.

17. The manufacturing method of the semiconductor device according to claim 12, wherein forming the charge storage layer is performed after forming the first tunneling oxide segment and forming the second tunneling oxide segment.

18. The manufacturing method of the semiconductor device according to claim 12, wherein forming the charge storage layer and forming the third tunneling oxide segment are performed in the same step.

19. The manufacturing method of the semiconductor device according to claim 12, further comprising:

forming an insulating layer on the charge storage layer, wherein the control gate is formed on the insulating layer after the insulating layer is formed on the charge storage layer.

20. The manufacturing method of the semiconductor device according to claim 19, wherein a top surface of the insulating layer is substantially conformal with a top surface of the tunneling oxide layer.

21. The manufacturing method of the semiconductor device according to claim 12, wherein the first thickness is larger than the second thickness by 36-38 Å, and the second thickness is larger than the third thickness by 3-5 Å.

22. The manufacturing method of the semiconductor device according to claim 12, wherein the first thickness is 56.5-57.5 Å, the second thickness is 19.5-20.5 Å, and the third thickness is 15.5-16.5 Å.

23. The manufacturing method of the semiconductor device according to claim 12, wherein a cross-sectional width of the first tunneling oxide segment, a cross-sectional width of the second tunneling oxide segment, and a cross-sectional width of the third tunneling oxide segment are substantially the same.

* * * * *